United States Patent
Lin et al.

(10) Patent No.: US 12,404,885 B2
(45) Date of Patent: Sep. 2, 2025

(54) LINKAGE MECHANISM AND LATCHING ASSEMBLY HAVING THE SAME

(71) Applicant: Fulian Precision Electronics (Tianjin) Co., LTD., Tianjin (CN)

(72) Inventors: Jia-Feng Lin, New Taipei (TW); Chieh-Hsiang Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 307 days.

(21) Appl. No.: 18/204,822

(22) Filed: Jun. 1, 2023

(65) Prior Publication Data

US 2024/0093706 A1 Mar. 21, 2024

(30) Foreign Application Priority Data

Sep. 16, 2022 (CN) .......................... 202211133262.6

(51) Int. Cl.
*F16B 2/18* (2006.01)
*H05K 5/02* (2006.01)

(52) U.S. Cl.
CPC ............ *F16B 2/185* (2013.01); *H05K 5/0221* (2013.01)

(58) Field of Classification Search
CPC .. F16B 2/18; F16B 2/185; F16B 5/008; F16B 5/0084; F16B 5/0642; F16B 12/2009; F16B 2005/0671; H05K 5/0221; H05K 5/023; H05K 7/1401; H05K 7/1402; H05K 7/1409; H05K 7/1487; H05K 7/1488; H05K 7/1489; Y10T 74/20396; Y10T 74/20612; Y10T 403/59; Y10T 403/591; Y10T 403/595
USPC .............. 74/491, 523; 403/321, 322.1, 322.4
See application file for complete search history.

(56) References Cited

U.S. PATENT DOCUMENTS

| | | | | |
|---|---|---|---|---|
| 4,213,666 A | * | 7/1980 | Braginetz | H01R 13/62905 74/491 |
| 6,568,876 B2 | * | 5/2003 | Augustin | B23Q 9/0064 403/322.4 |
| 8,096,627 B2 | * | 1/2012 | Lin | H05K 5/0221 312/325 |
| 12,305,682 B2 | * | 5/2025 | Lin | F16B 2/185 |
| 2024/0295257 A1 | * | 9/2024 | Lin | F16B 2/18 |
| 2024/0334635 A1 | * | 10/2024 | Wang | H05K 7/1488 |
| 2024/0407124 A1 | * | 12/2024 | Lin | H05K 7/1489 |
| 2025/0016946 A1 | * | 1/2025 | Lin | H05K 7/1401 |

* cited by examiner

*Primary Examiner* — Josh Skroupa
(74) *Attorney, Agent, or Firm* — ScienBiziP, P.C.

(57) ABSTRACT

A linkage mechanism includes a first fixing member and a movable member. The first fixing member defines a first slot. The movable member includes a handle, a steering plate, and a latching plate. The handle is rotatably connected to the first fixing member. The steering plate has first and second portions. The first portion is rotatably connected to the handle. The second portion has a sliding slot. The latching plate includes a main body portion, latching portion, and sliding post. The main body portion is rotatably attached to the first fixing member about a first axis. Part of the main body portion extends to form the latching portion. The latching portion corresponds to the first slot. One end of the sliding post is fixed to the main body portion. Another end movably fits into the sliding slot.

18 Claims, 5 Drawing Sheets

LINKAGE MECHANISM AND LATCHING ASSEMBLY HAVING THE SAME

FIELD

The subject matter herein generally relates to a linkage mechanism and a latching assembly having the linkage mechanism.

BACKGROUND

A server is movably installed in a server cabinet through a latch mechanism. The latch mechanism may include a handle and a latching hook connected to the handle. The handle can be rotated when being operated, and the rotating handle can drive the latching hook to rotate, so that the latching hook can be engaged with or separated from the housing of the server and the server cabinet.

However, in order to save labor, the handle is designed to be long, which results in a larger space required by rotating the handle and is not conducive to actual operation.

BRIEF DESCRIPTION OF THE DRAWINGS

Implementations of the present technology will now be described, by way of example only, with reference to the attached figures, wherein.

DETAILED DESCRIPTION

Figure 1:
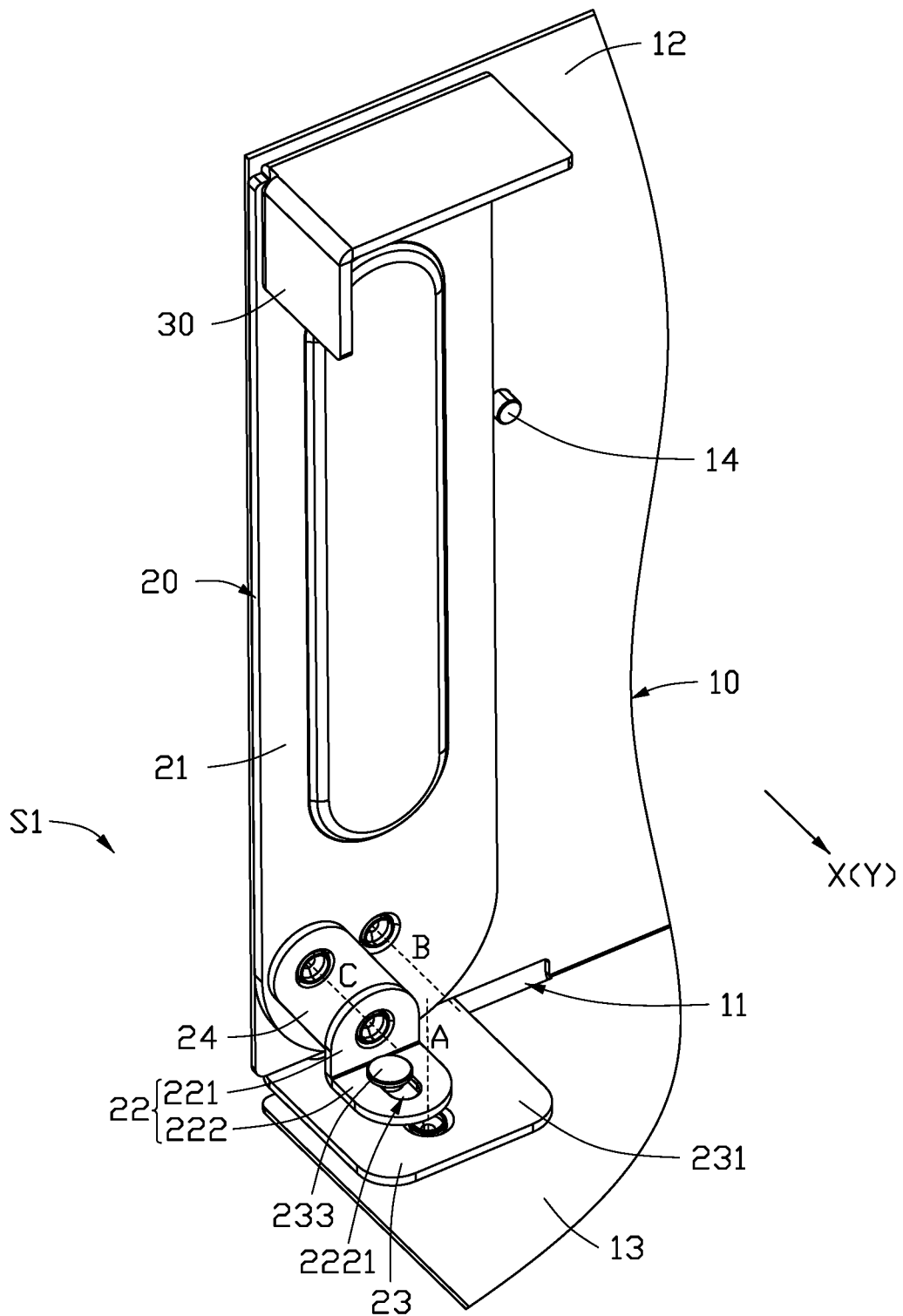
FIG. 1 is a diagrammatic view of a linkage mechanism according to an embodiment of the present disclosure, wherein the linkage mechanism is in a first state.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Referring to FIG. 1, an embodiment of the present application provides a linkage mechanism 100, which can be used in a housing (e.g., a first fixing member 10 shown in FIG. 5) of a server. The housing may be engaged with or separated from a server cabinet (e.g., a second fixing member 201 shown in FIG. 5) through the linkage mechanism 100.

Figure 2:
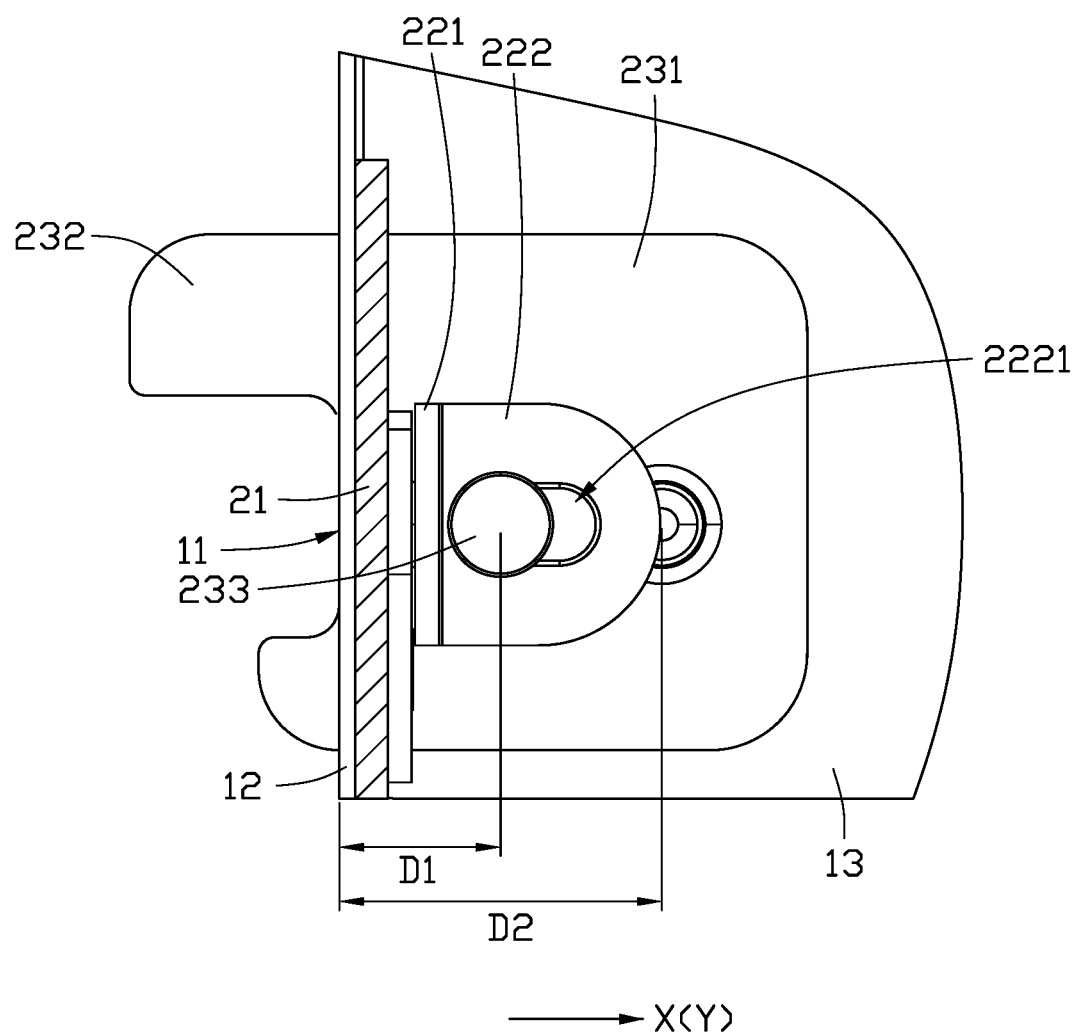
FIG. 2 is a top view of the linkage mechanism of FIG. 1.

Referring to FIGS. 1 and 2, the linkage mechanism 100 includes a first fixing member 10 and a movable member 20 disposed on the first fixing member 10. The first fixing member 10 defines a first slot 11. A portion of the movable member 20 can movably pass through the first slot 11, and the portion of the movable member 20 that passes through the first slot 11 can be engaged with other components (e.g., the second fixing member 201), so that the housing and the server cabinet are engaged with each other.

The first fixing member 10 includes a first side plate 12 and a second side plate 13 vertically connected to the first side plate 12. The first slot 11 penetrates a connecting area between the first side plate 12 and the second side plate 13.

The movable member 20 includes a handle 21, a steering plate 22, and a latching plate 23. The handle 21 is rotatably disposed on one side of the first side plate 12. The latching plate 23 is rotatably disposed on one side of the second side plate 13 facing the first side plate 12. The steering plate 22 is connected between the handle 21 and the latching plate 23.

The steering plate 22 includes a first portion 221 and a second portion 222 vertically connected to the first portion 221. The first portion 221 is rotatably connected to the handle 21, and the second portion 222 defines a sliding slot 2221.

The latching plate 23 includes a main body portion 231, a latching portion 232, and a sliding post 233. The main body portion 231 is substantially plate-shaped and rotatably disposed on the second side plate 13 about a first rotation axis A. A portion of the main body portion 231 extends to form the latching portion 232, and the latching portion 232 corresponds to the first slot 11. One end of the first sliding post 233 is fixedly disposed on a side of the main body portion 231 opposite to the second side plate 13, and another end of the sliding post 233 is movably accommodated in the sliding slot 2221. The sliding post 233 is misaligned with the first rotation axis A.

Figure 3:
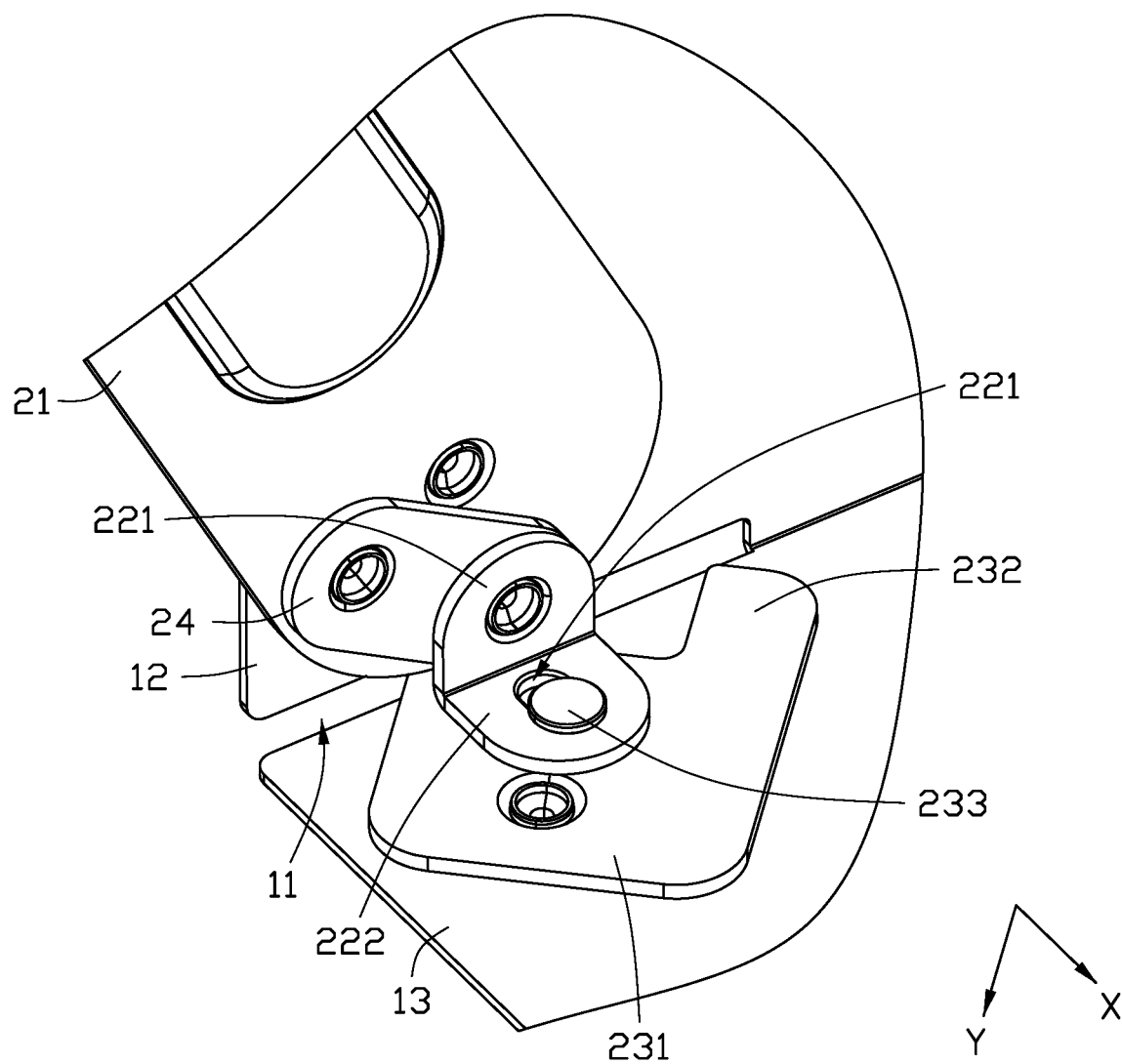
FIG. 3 is similar to FIG. 1, but showing the linkage mechanism in a second state.
Figure 4:
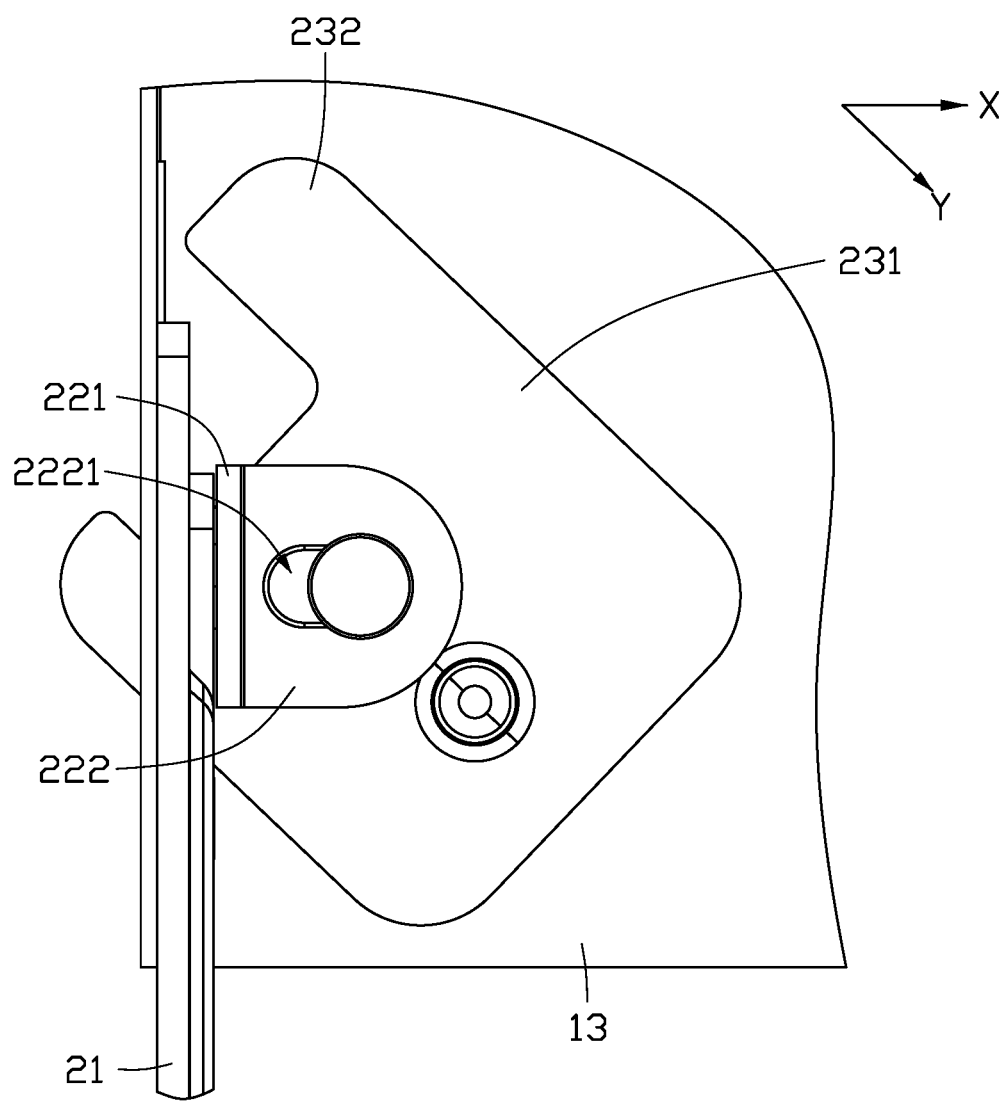
FIG. 4 is a top view of the linkage mechanism of FIG. 3.

Referring to FIGS. 2 and 3, the linkage mechanism 100 includes a first state 51 and a second state S2. The first state 51 is that the latching portion 232 passes through the first slot 11. The second state S2 is that the latching portion 232 does not pass through the first slot 11. In use, to allow the linkage mechanism 100 to switch from the second state S2 to the first state 51, the handle 21 rotates when operated by an operator, and the rotating handle 21 then drives the steering plate 22 to move. The steering plate 22 drives the sliding post 233 to move, thereby causing the main body portion 231 to rotate about the first rotation axis A, and the latching portion 232 to pass through or exit the first slot 11.

The linkage mechanism 100 provided by the present application connects the handle 21 and the latching portion 232 through the steering plate 22, so that the rotation direction of the handle 21 can be different from the rotation direction of the latching portion 232, which is beneficial to avoid the narrow space where server components are densely arranged in the server cabinet or to reduce the operating space.

Referring to FIGS. 2 and 3, in this embodiment, a first direction X is defined as an extending direction of the sliding slot 2221, and a second direction Y is defined as a direction from the sliding post 233 to the first rotation axis A. The first direction X is not perpendicular to the second direction Y. When the linkage mechanism 100 is in the first state 51, the first direction X coincides with the second direction Y. When the linkage mechanism 100 is in the second state S2, an angle of about 45 degrees is formed between the first direction X and the second direction Y, so that the handle 21 can rotate about 45 degrees to switch the linkage mechanism 100 from the first state 51 to the second state S2.

Referring to FIGS. 1 and 2, in this embodiment, a distance D1 between the sliding post 233 and the first slot 11 is less than a distance D2 between the first rotation axis A and the first slot 11. A portion of the main body portion 231 facing the first slot 11 extends along the second direction Y to form the latching portion 232, thereby facilitating the rotation of the main body portion 231 to drive the latching portion 232 to enter or exit the first slot 11.

Referring to FIGS. 1 and 3, in this embodiment, the movable member 20 further includes a connecting plate 24. One end of the connecting plate 24 is rotatably connected to the first portion 221, and the other end of the connecting plate 24 is rotatably connected to the handle 21. The connecting plate 24 can help to improve smooth operation, so that the handle 21 can flexibly drive the steering plate 22 to move. Furthermore, the connecting plate 24 can ensure that the second portion 222 can move in a direction substantially parallel to the second side plate 13.

Referring to FIGS. 1 and 3, in this embodiment, the handle 21 is rotatably disposed on the first side plate 12 about a second rotation axis B. The connecting plate 24 is rotatably disposed on the handle 21 about a third rotation axis C. The second rotation axis B and the third rotation axis C are misaligned with each other, so that the handle 21 can drive the connecting plate 24 to rotate.

Referring to FIGS. 1 and 3, in this embodiment, the first fixing member 10 further includes a stopper 14. The stopper 14 is substantially cylindrical. One end of the stopper 14 is fixedly disposed on the first side plate 12. The other end of the stopper 14 protrudes from the first side plate 12, and is used to prevent the handle 21 from over-rotating.

Referring to FIGS. 1 and 3, in this embodiment, the linkage mechanism 100 further includes an anti-slip member 30. The anti-slip member 30 protrudes from one end of the handle 21 opposite to the steering plate 22. The anti-slip member 30 is used to prevent the operator's arm from slipping when rotating the handle 21.

Figure 5:
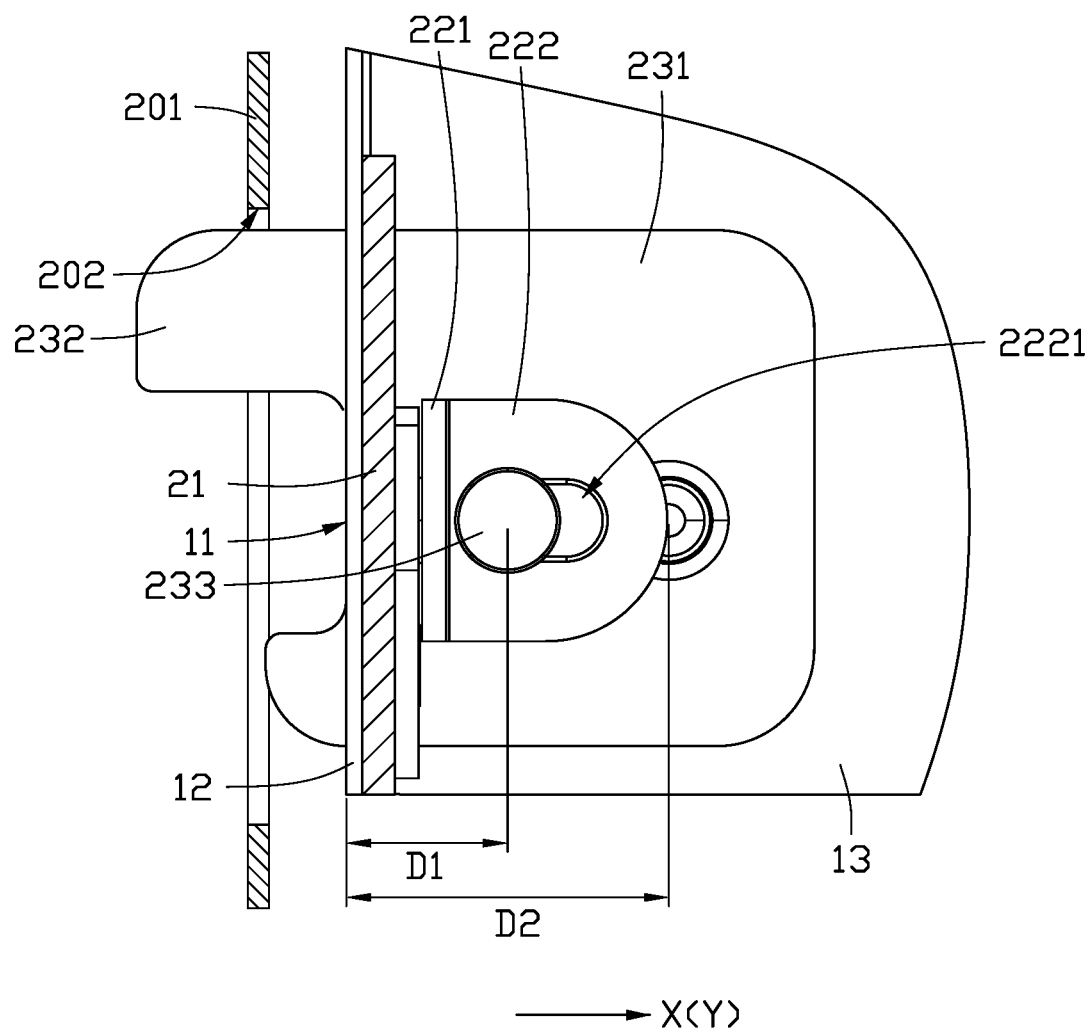
FIG. 5 is a diagrammatic view of a latching assembly according to an embodiment of the present application.

Referring to FIG. 5, an embodiment of the present application further provides a latching assembly 200. The latching assembly 200 includes a second fixing member 201 and the linkage mechanism 100. The second fixing member 201 defines a second slot 202 corresponding to the first slot 11. The latching portion 232 can pass through the first slot 11 and the second slot 202, so that the first fixing member 10 and the second fixing member 201 are engaged with each other. In use, the linkage mechanism 100 is first in the second state S2. Secondly, the linkage mechanism 100 in the second state S2 is disposed corresponding to the second fixing member 201 so that the first slot 11 corresponds to the second slot 202. Thirdly, the linkage mechanism 100 is switched from the second state S2 to the first state 51, so that the latching portion 232 passes through the first slot 11 and the second slot 202 to engage the linkage mechanism 100 and the second fixing member 201 together.

The embodiments shown and described above are only examples. Many details are often found in the art such as the other features of the latching assembly 200. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A linkage mechanism comprising:
a first fixing member defining a first slot; and
a movable member comprising:
a handle rotatably connected to the first fixing member;
a steering plate comprising a first portion and a second portion connected to the first portion, the first portion is rotatably connected to the handle, and the second portion defining a sliding slot, and
a latching plate comprising a main body portion, a latching portion, and a sliding post, the main body portion is rotatably disposed on the first fixing member about a first rotation axis, a portion of the main body portion extends to form the latching portion, the latching portion corresponds to the first slot, one end of the sliding post is fixed to the main body portion, another end of the sliding post is movably accommodated in the sliding slot, and the sliding post is misaligned with the first rotation axis.

2. The linkage mechanism according to claim 1, wherein a first direction is defined as an extending direction of the sliding slot, a second direction is defined as a direction from the sliding post to the first rotation axis, the first direction is inclined with the second direction, and a distance between the sliding post and the first slot is less than a distance between the first rotation axis and the first slot.

3. The linkage mechanism according to claim 2, wherein the portion of the main body portion faces the first slot and extends along the second direction to form the latching portion.

4. The linkage mechanism according to claim 1, further comprises a connecting plate, wherein one end of the connecting plate is rotatably connected to the first portion, and another end of the connecting plate is rotatably connected to the handle.

5. The linkage mechanism according to claim 4, wherein the handle is rotatably disposed on the first fixing member about a second rotation axis, the connecting plate is rotatably disposed on the handle about a third rotation axis, and the second rotation axis is misaligned with the third rotation axis.

6. The linkage mechanism according to claim 5, wherein the first fixing member comprises a first side plate and a second side plate connected to the first side plate, the handle is rotatably disposed on the first side plate, the main body portion is rotatably disposed on the second side plate, and the first slot is disposed at a connecting area between the first side plate and the second side plate.

7. The linkage mechanism according to claim 6, wherein the first portion is vertically connected to the second portion, and the first side plate is vertically connected to the second side plate.

8. The linkage mechanism according to claim 6, further comprises a stopper, wherein the stopper is disposed on the first side plate, and the stopper is configured to prevent the handle from rotating.

9. The linkage mechanism according to claim 1, further comprises an anti-slip member, wherein the anti-slip member protrudes from one end of the handle away from the steering plate.

10. A latching assembly comprising:
a linkage mechanism comprising:
  a first fixing member defining a first slot; and
  a movable member comprising:
    a handle connected to the first fixing member;
    a steering plate comprising a first portion and a second portion connected to the second portion, the first portion is rotatably connected to the handle, and the second portion defining a sliding slot, and
    a latching plate, the latching plate comprising a main body portion, a latching portion, and a sliding post, the main body portion is rotatably disposed on the first fixing member about a first rotation axis, a portion of the main body portion extends to form the latching portion, the latching portion corresponds to the first slot, one end of the sliding post is fixed to the main body portion, another end of the sliding post is movably accommodated in the sliding slot, and the sliding post is offset from the first rotation axis,
  a second fixing member defining a second slot corresponding to the first slot, wherein the latching portion extends through the first slot and extends into the second slot.

11. The latching assembly according to claim 10, wherein a first direction is defined as an extending direction of the sliding slot, a second direction is defined as a direction from the sliding post to the first rotation axis, the first direction is inclined with the second direction, and a distance between the sliding post and the first slot is less than a distance between the first rotation axis and the first slot.

12. The latching assembly according to claim 11, wherein the portion of the main body portion facing the first slot extends along the second direction to form the latching portion.

13. The latching assembly according to claim 10, further comprises a connecting plate, wherein one end of the connecting plate is rotatably connected to the first portion, and another end is rotatably connected to the handle.

14. The latching assembly according to claim 13, wherein the handle is rotatably disposed on the first fixing member about a second rotation axis, the connecting plate is rotatably disposed on the handle about a third rotation axis, and the second rotation axis is misaligned with the third rotation axis.

15. The latching assembly according to claim 14, wherein the first fixing member comprises a first side plate and a second side plate connected to the first side plate, the handle is rotatably disposed on the first side plate, the main body portion is rotatably disposed on the second side plate, and the first slot is disposed at a connecting area between the first side plate and the second side plate.

16. The latching assembly according to claim 15, wherein the first portion is vertically connected to the second portion, the first side plate is vertically connected to the second side plate.

17. The latching assembly according to claim 15 further comprises a stopper, wherein the stopper is disposed on the first side plate, and the stopper is configured to prevent the handle from rotating.

18. The latching assembly according to claim 10 further comprises an anti-slip member, wherein the anti-slip member protrudes from one end of the handle away from the steering plate.

* * * * *